United States Patent
Park

(10) Patent No.: US 7,365,347 B2
(45) Date of Patent: Apr. 29, 2008

(54) ION IMPLANTATION APPARATUS FOR USE IN MANUFACTURING OF SEMICONDUCTOR DEVICE

(75) Inventor: Jin Ha Park, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 293 days.

(21) Appl. No.: 11/166,679

(22) Filed: Jun. 23, 2005

(65) Prior Publication Data

US 2005/0285539 A1   Dec. 29, 2005

(30) Foreign Application Priority Data

Jun. 24, 2004   (KR) ............... 10-2004-0047590

(51) Int. Cl.
  *G01K 1/08*   (2006.01)
  *H01J 3/14*   (2006.01)
  *H01J 3/26*   (2006.01)

(52) U.S. Cl. ............... 250/492.21; 250/492.1; 250/397; 315/111.81; 438/514

(58) Field of Classification Search ............... 250/400, 250/492.21, 397; 315/111.81; 438/514
See application file for complete search history.

(56) References Cited

U.S. PATENT DOCUMENTS 6,909,102 B1 *   6/2005   Buccos ............... 250/492.21

FOREIGN PATENT DOCUMENTS

JP   5-53116   7/1993
JP   6-36200   5/1994

OTHER PUBLICATIONS

English Abstract of Japanese Patent JP6-36200; Korea Patent Gazzete; May 13, 1994; Korean Intellectual Property Office, Republic of Korea.
English Abstract of Japanese Patent JP5-53116; Korea Patent Gazzete; Jul. 13, 1993; Korean Intellectual Property Office, Republic of Korea.

* cited by examiner

*Primary Examiner*—Jack Berman
*Assistant Examiner*—Meenakshi S Sahu
(74) *Attorney, Agent, or Firm*—Andrew D. Fortney; Alec B. Plumb

(57) ABSTRACT

Disclosed herein is an ion implantation apparatus for use in manufacturing of a semiconductor device, which has a software program including an option for selecting a manipulator, enabling a time for beam tuning to be minimized. The ion implantation apparatus further includes a manipulator for extracting and focusing an ion source and an ion beam, a control block for controlling overall operation of the ion implantation apparatus and recognizing a newly installed manipulator, and a control window on which a selection menu is displayed, allowing recipe data to be selected on a screen. When installing a replacement manipulator, recipe data for the replacement manipulator can be selected to improve beam tuning set up time.

9 Claims, 2 Drawing Sheets

ION IMPLANTATION APPARATUS FOR USE IN MANUFACTURING OF SEMICONDUCTOR DEVICE

This application claims the benefit of Korean Patent Application No. P2004-47590, filed on Jun. 24, 2004, which is hereby incorporated by reference as if fully set forth herein.

BACKGROUND OF THE INVENTION

1. Field of the Invention

The present invention relates to an ion implantation apparatus, and more particularly, to an ion implantation apparatus for use in manufacturing a semiconductor device, which has a software program including an option for allowing selection of a manipulator, thereby enabling a time for beam tuning to be minimized.

2. Discussion of the Related Art

Generally, ion implantation for implanting impurities into a silicon wafer has characteristics which can overcome limitations of a thermal diffusion method, such as a lower frequency of impurity diffusion towards a side surface (in comparison to the thermal diffusion method) and/or lower temperature processing (e.g., a lower thermal budget), leading to more accurate formation of a doped area without damaging a photoresist, and the like. Thus, ion implantation has been widely used in manufacturing integrated semiconductor devices.

An ion implantation apparatus is an apparatus for implanting impurity ions by selecting and accelerating the impurity ions, generally in a predetermined amount. Ion implantation apparatuses may be classified into medium-current ion implantation apparatuses, high-current ion implantation apparatuses, and high-energy ion implantation apparatuses, according to process conditions. The ion implantation apparatus generally comprises an ion generator (hereinafter referred to as a "manipulator"), a beam line, and an end station as main components.

The manipulator may comprise a source head for ionizing a gas by forcing a source gas to collide with thermal electrons emitted from a filament, an extraction electrode for extracting ions by applying an electromagnetic field to the respective ions, and a suppressor for suppressing secondary electrons from being generated when generating ion beams and extracting the ions by use of the electromagnetic field.

The source head is equipped with an arc chamber in which the ion beam is generated and a disc having a front slit positioned after the arc chamber in the path of ion beam, so that when the ion beam exits the arc chamber by virtue of the electromagnetic field, it passes through the front slit of the disc.

A conventional ion implantation apparatus for use in manufacturing a semiconductor device will be described with reference to the accompanying drawings.

FIG. 1 is a diagram illustrating the structure of a manipulator of the conventional ion implantation apparatus.

The conventional ion implantation apparatus of FIG. 1 generally comprises a manipulator for extracting and focusing a source and a beam, an analyzer magnet for distinguishing desired ions among the plural ions extracted from the manipulator, and an end station on which a wafer to be ion implanted is located and is subjected to ion implantation.

In the ion implantation apparatus constructed as described above, operation of the manipulator for extracting and focusing the beam is shown in FIG. 1.

While moving in X, Y, and Z directions, the manipulator optimizes the beam generating conditions, and transfers the beam conditions to the analyzer magnet in the next stage.

Movement of an electrode in the three directions as mentioned above is driven by an encoder motor (not shown), and, when the beam set up is completed, encoder values of the respective directions are stored in a recipe.

Accordingly, when performing ion implantation with the encoder values of the associated recipe, the encoder values of the associated recipe are taken from a control block controlling the ion implantation apparatus, thereby reducing a time for setting the respective directions of the manipulator.

Here, the time for setting the respective directions generally takes about 2~3 minutes for ion implantation using a recipe having different encoder values.

However, since there may be an error (e.g., in alignment of) the respective axes between the manipulators in such a conventional ion implantation apparatus, there may be problems as follows, particularly when replacing a manipulator assembly with a new one during a prevention maintenance cycle (also referred to as a "PM cycle").

For example, when using two manipulator assemblies A and B, in which the center of X is set to 500 for the manipulator assembly A and to 550 for the manipulator assembly B, problems may arise as follows when replacing the one manipulator assembly with another at the PM cycle.

When setting up or establishing a beam after replacing a first manipulator assembly A with a second manipulator assembly B, since a computer adapted to control the apparatus cannot recognize the replaced manipulator assembly, the manipulator assembly B is set up or initiated with the values of the manipulator assembly A, while a beam current is controlled using different conditions such as an arc current and a source magnet, causing consumption of time for beam tuning.

Additionally, during a process of setting up the manipulator B using the values of the manipulator assembly A, the manipulator assembly B may be off-center. However, even in this case, since the previous recipe of the manipulator assembly A is still used for the manipulator assembly B, the computer may make an error in determining that the manipulator assembly B is located at the center of the chamber.

Such increases in set up time for beam tuning and a location determination error cause reductions in productivity. This reduction of productivity is serious in a semiconductor wafer foundry that may use a number of recipes for the same ion implantation equipment and/or process.

SUMMARY OF THE INVENTION

Accordingly, the present invention is directed to an ion implantation apparatus that substantially obviates one or more problems due to limitations and disadvantages of the related art.

An object of the present invention is to provide an ion implantation apparatus for use in manufacturing of a semiconductor device, which has a software program including an option for allowing selection of a manipulator, thereby enabling a time for beam tuning to be minimized.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an ion implantation apparatus including a manipulator for extracting and focusing a source and a beam for use in manufacturing of a semiconductor device, the apparatus comprising: a control block for controlling overall operation of the ion implantation apparatus and recognizing a newly installed manipulator; and a control window on which a selection menu is displayed for allowing recipe data to be selected on a screen such that, when installing a replacement manipulator, recipe data of the replacement manipulator can be applied to beam tuning.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
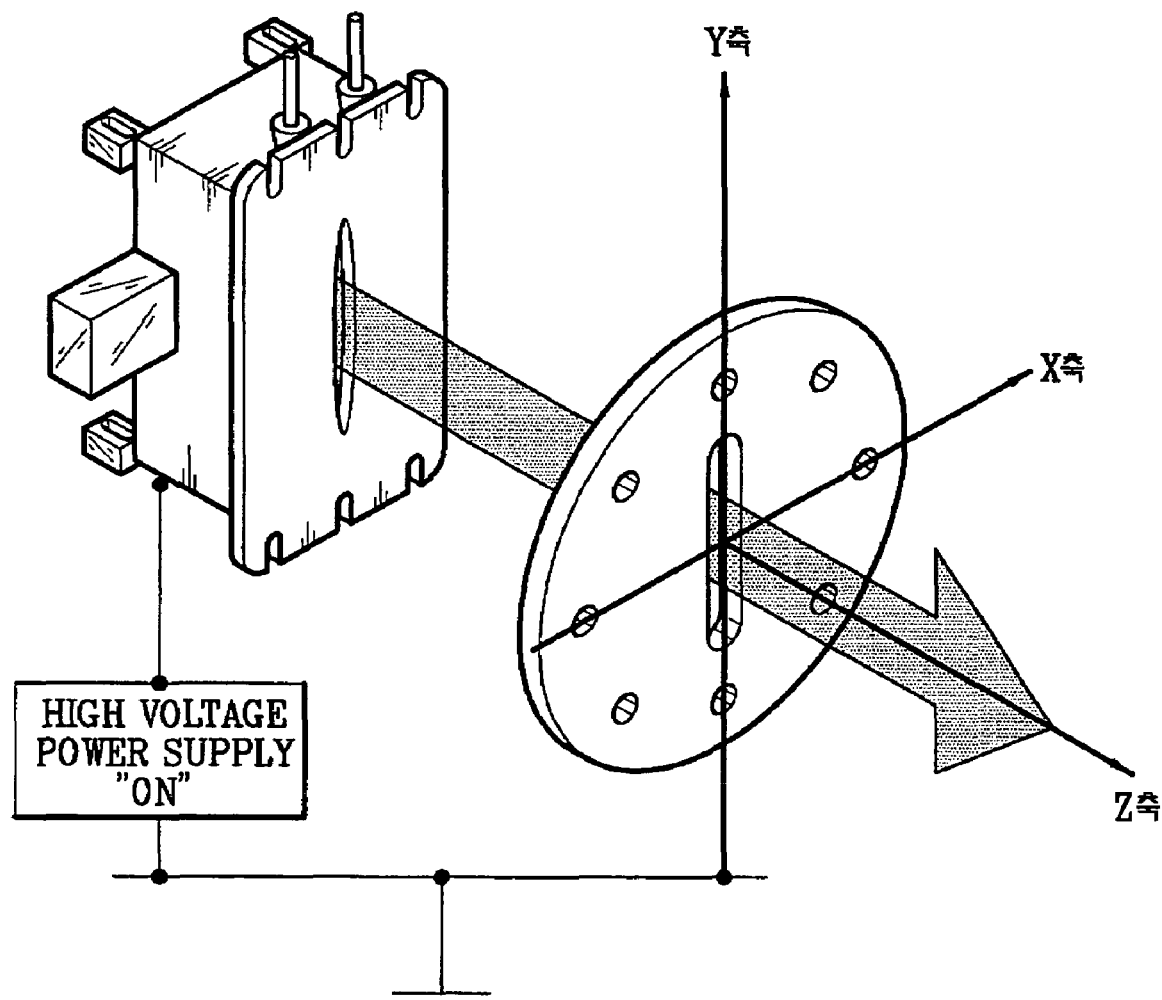
FIG. 1 is a diagram illustrating the structure of a manipulator of a conventional ion implantation apparatus.
Figure 2:
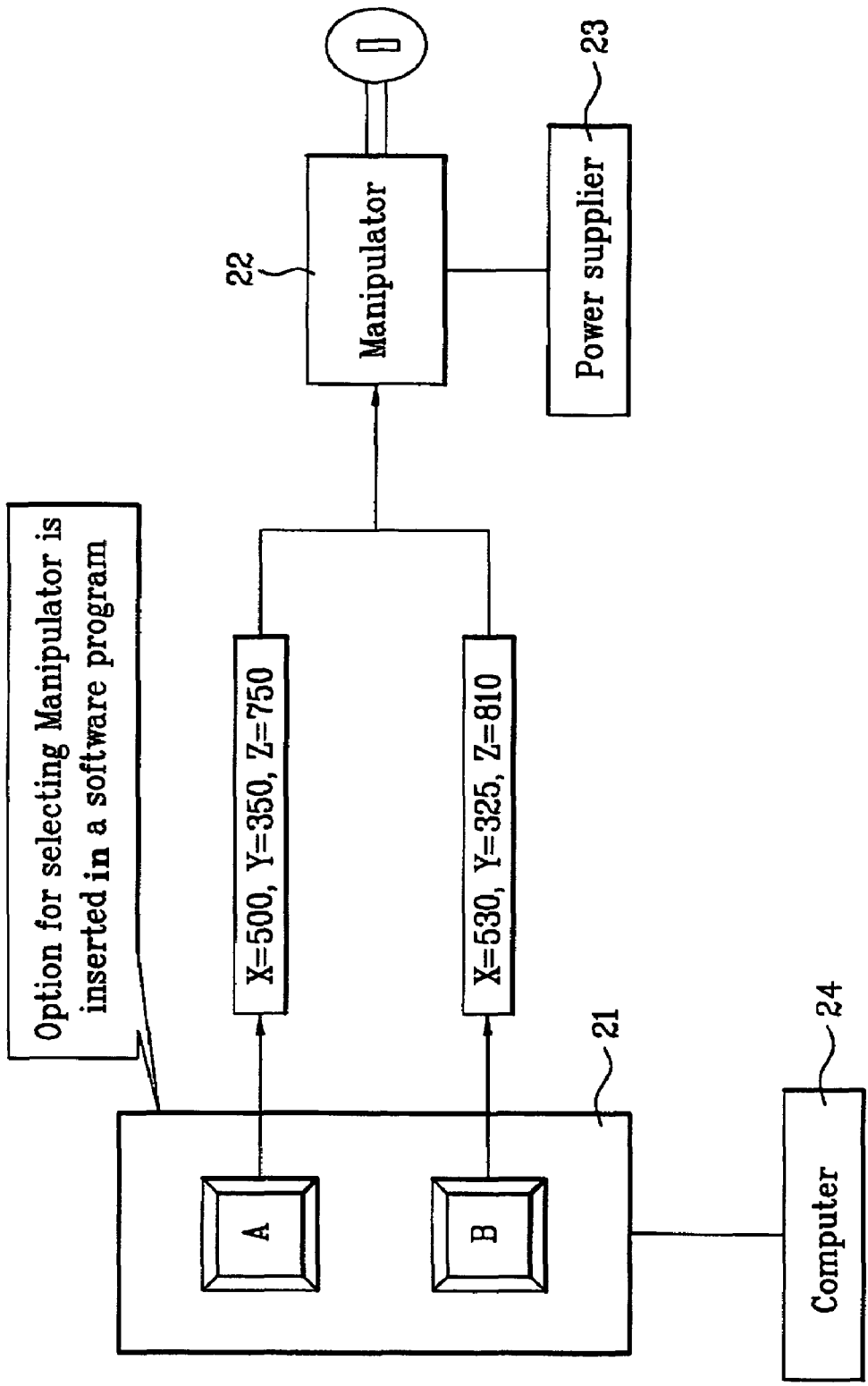
FIG. 2 is a diagram illustrating the structure of a manipulator of an ion implantation apparatus in accordance with the present invention.

FIG. 2 is a diagram illustrating the structure of a manipulator of an ion implantation apparatus in accordance with the invention.

The present invention is characterized in that a newly installed manipulator can be recognized by a computer controlling the overall operation of an ion implantation apparatus so as to reduce a beam set up time.

The ion implantation apparatus of the invention generally comprises a manipulator for extracting and focusing a source and a beam, an analyzer magnet for distinguishing desired ions among the plural ions extracted from the manipulator, an end station on which a wafer to be ion implanted is located and subjected to ion implantation, and a computer configured to control the ion implantation process implemented by the ion implantation apparatus.

Thus, as shown in FIG. 2, the ion implantation apparatus of the invention further comprises a computer 24, capable of recognizing (or configured to recognize) at least two manipulators. The computer 24 may be further configured to control component blocks of the apparatus, and may further comprise a control window having an interface (e.g., a graphical user interface, or GUI) controlled or implemented by the software program (and/or corresponding source and/or object code) which allows selection of recipes A and B having data related to the at least two manipulators, and on which a selection menu may be displayed for allowing data for beam set up to be selected depending on the installed manipulators using the software program.

Here, the manipulator further comprises an electrode provided with an encoder motor for adjusting the location (e.g., traveling directions) of an ion beam in respective axial directions (e.g., X, Y, and Z), using data stored in the recipes.

As such, since each of the recipes has data for each of the manipulators A and B, when using the manipulator A, a beam from the manipulator A is set up using data A for the manipulator A stored in the associated recipe, and when using the manipulator B, a beam from the manipulator B is set up using data B for the manipulator B stored in the associated recipe, thereby reducing time consumption for beam tuning.

When the manipulator A is mounted in the ion implantation apparatus, the data A of the associated recipe may be selected on the control window 21, and thus the beam is tuned using optimized conditions of, for example, X=500, Y=350, and Z=750.

When the manipulator B is mounted in the ion implantation apparatus, the data B of the associated recipe is selected on the control window 21, and thus the beam is tuned using optimum conditions of, for example, X=530, Y=325, and Z=810.

The ion implantation apparatus of the invention, constructed to recognize the installed manipulators as described above, has advantages as follows.

Unlike memory semiconductors, several dozen recipes may be used in the same ion implantation apparatus in the when manufacturing non-memory semiconductors.

Accordingly, recipe tuning may be performed for respective lots of wafers, and the ion implantation apparatus of the invention enables a time for beam tuning after protective maintenance to be shortened.

This means that the ion implantation apparatus of the invention enables more rapid lot processing.

For example, when replacement of recipes is performed four times an hour, it shortens a tuning time by about 10 minutes, enabling an additional 10 wafers to be processed during what would have otherwise been time consumed for recipe replacement. As a result, production can be increased by an additional 240 wafers per day.

Meanwhile, when hardware (e.g., apparatus) conditions are controlled with erroneous set up data (for example, the manipulator A is erroneously replaced with the manipulator B at the PM cycle), the apparatus can be damaged, shortening the PM cycle. However, according to the invention, erroneous set up of the manipulator can be minimized.

The ion implantation apparatus according to the invention can shorten the time for beam tuning and can prevent improper set up of the manipulator.

As is apparent from the above description, the ion implantation apparatus according to the invention has advantageous effects as follows.

Firstly, since the computer of the ion implantation apparatus can recognize a newly installed manipulator, it is possible to reduce a time for beam tuning after protective maintenance. As a result, more rapid lot processing is enabled, thereby enhancing productivity per unit hour.

Secondly, since erroneous set up of the manipulator is prevented, and hardware operation for correcting the error is not required, apparatus damage can be reduced.

It will be apparent to those skilled in the art that various modifications and variations can be made in the present invention without departing from the spirit or scope of the inventions.

Thus, it is intended that the present invention covers the modifications and variations of this invention, generally within the scope of the appended claims and their equivalents.

What is claimed is:

1. An ion implantation apparatus for extracting and focusing an ion beam, comprising:
   a control block for controlling overall operation of the ion implantation apparatus and recognizing a newly installed manipulator; and
   a control window on which a selection menu is displayed, for allowing recipe data to be selected on a screen such that, when installing a replacement manipulator, recipe data of the replacement manipulator can be applied to beam tuning.

2. The apparatus according to claim 1, wherein the comprises an electrode and an encoder motor for adjusting a location of an ion beam in axial directions using the recipe data.

3. The apparatus of according to claim 1, further comprising an analyzer magnet configured to distinguish desired ions from among a plurality of ions extracted by the installed manipulator.

4. The apparatus of according to claim 1, further comprising an end station on which a wafer to be ion implanted is located and subjected to ion implantation.

5. The apparatus according to claim 1, comprising a computer configured to control an ion implantation process implemented by the ion implantation apparatus.

6. The apparatus according to claim 1, wherein the control window comprises an interface controlled or implemented by a software program allowing selection of one of a plurality of recipes, each having data related to a corresponding manipulator, and the selection menu allows recipe data to be selected depending on the installed manipulator.

7. A method of setting up and/or installing a beam manipulator in an ion implantation apparatus, comprising:
   replacing an old beam manipulator with a new beam manipulator;
   recognizing the new beam manipulator from a plurality of beam manipulators; and
   selecting recipe data corresponding to the new beam manipulator.

8. The method according to claim 7, wherein the recipe data comprises data for adjusting a location of an ion beam in axial directions.

9. The method according to claim 7, further comprising generating said ion beam after selecting the recipe data.

* * * * *